United States Patent
Martin et al.

(10) Patent No.: US 7,745,321 B2
(45) Date of Patent: Jun. 29, 2010

(54) SOLDER CONTACTS AND METHODS OF FORMING SAME

(75) Inventors: Alfred Martin, Munich (DE); Barbara Hasler, Munich (DE); Martin Franosch, Munich (DE); Klaus-Guenter Oppermann, Holzkirchen (DE)

(73) Assignee: Qimonda AG, Munich (DE)

( * ) Notice: Subject to any disclaimer, the term of this patent is extended or adjusted under 35 U.S.C. 154(b) by 129 days.

(21) Appl. No.: 11/972,793

(22) Filed: Jan. 11, 2008

(65) Prior Publication Data

US 2009/0179333 A1    Jul. 16, 2009

(51) Int. Cl.
*H01L 21/44* (2006.01)
*H01L 21/4763* (2006.01)

(52) U.S. Cl. .................. 438/612; 438/613; 438/618; 438/615

(58) Field of Classification Search ................. 438/612, 438/614, 618, 666, 613, 611
See application file for complete search history.

(56) References Cited

U.S. PATENT DOCUMENTS

| | | | | |
|---|---|---|---|---|
| 5,135,606 A | * | 8/1992 | Kato et al. ................ 216/20 |
| 5,587,623 A | * | 12/1996 | Jones ................ 313/497 |
| 6,047,044 A | | 4/2000 | Lehmann et al. | |
| 6,191,952 B1 | | 2/2001 | Jimarez et al. | |
| 6,245,595 B1 | | 6/2001 | Nguyen et al. | |
| 7,263,769 B2 | * | 9/2007 | Morimoto et al. ............. 29/852 |
| 2003/0001992 A1 | * | 1/2003 | Kawase et al. ............. 349/106 |
| 2004/0092117 A1 | | 5/2004 | Suemasu et al. | |
| 2008/0099925 A1 | | 5/2008 | Irsigler et al. | |

FOREIGN PATENT DOCUMENTS

| | | |
|---|---|---|
| DE | 19542043 | 8/1996 |
| DE | 19729596 | 1/1999 |
| DE | 10351924 | 6/2004 |
| JP | 3627856 | 5/2002 |
| JP | 2002158191 | 3/2005 |

* cited by examiner

*Primary Examiner*—Chuong A. Luu
(74) *Attorney, Agent, or Firm*—Patterson & Sheridan, L.L.P.

(57) ABSTRACT

An integrated circuit that comprises a substrate and a structured layer on the substrate. The structured layer comprises an opening to the substrate, a first field and a second field on the substrate, wherein the first field and the second field, at least in part, overlap with the opening. The integrated circuit further comprises a first material in the area of the first field and a second material in the area of the second field. The first material impedes a wetting by a solder material, and the second provides a wetting by the solder material.

11 Claims, 14 Drawing Sheets

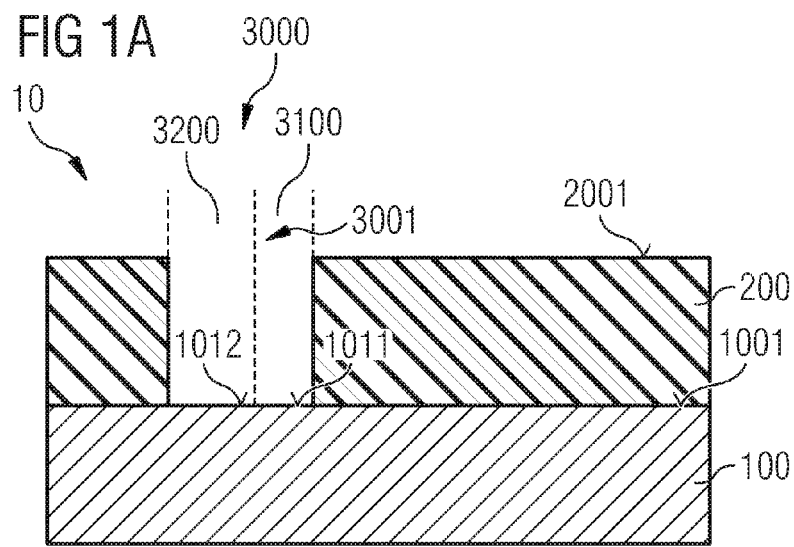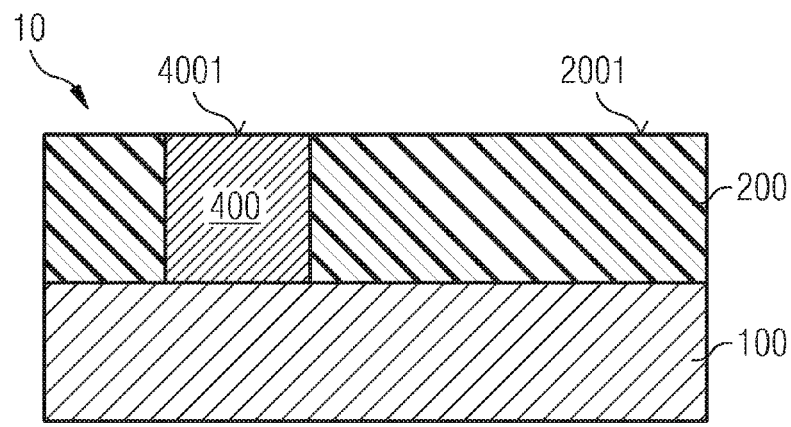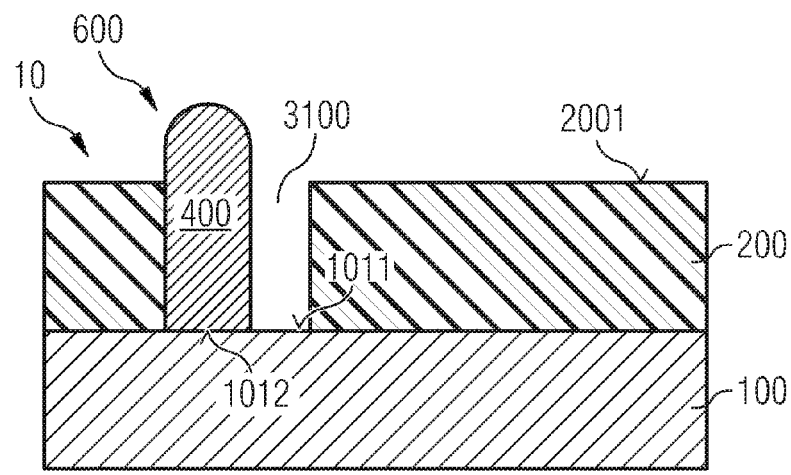

SOLDER CONTACTS AND METHODS OF FORMING SAME

BACKGROUND OF THE INVENTION

The invention relates to integrated circuit and circuit system manufacturing methods and structures, and more particularly to methods of forming electrical and mechanical connections for an integrated circuit and circuit system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A through 1C show an integrated circuit in various stages during manufacturing according to one embodiment;

DETAILED DESCRIPTION OF THE PREFERRED EMBODIMENT

Figure 2A:
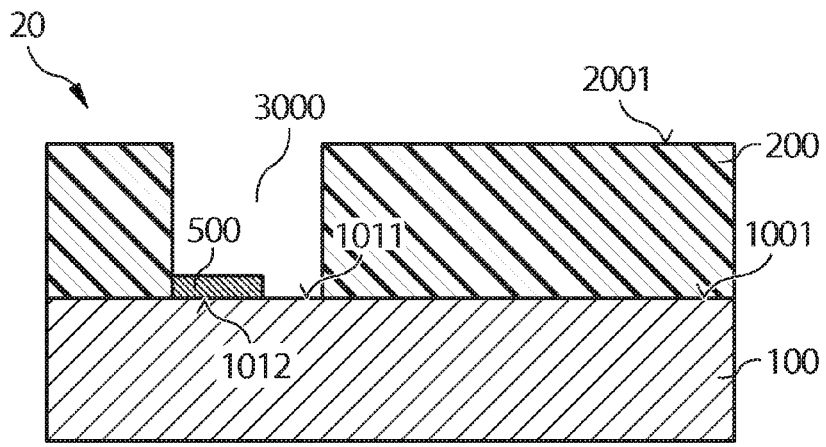
FIGS. 2A through 2C show an integrated circuit in various stages during manufacturing according to another embodiment.

Various implementations of the present invention may provide particular advantages for an improved method of forming a solder contact, an improved method of fabricating an integrated circuit, an improved integrated circuit, and an improved circuit system.

The recited features will become clear from the following description of implementations of the present invention, taken in conjunction with the accompanying drawings. It is to be noted, however, that the accompanying drawings illustrate only typical implementations of the present invention, and are, therefore, not to be considered limiting of the scope of the invention. The present invention may admit equally effective implementations.

FIGS. 1A through 1C show an integrated circuit in various stages during manufacturing according to one embodiment. Accordingly, a solder contact is being formed to an integrated circuit. As shown in FIG. 1A, an integrated circuit 10 comprises a structured layer 200 and a substrate 100. The structured layer 200, comprising an opening 3000, is arranged on a substrate surface 1001 of the substrate 100. The opening 3000, which exposes a part of the substrate surface 1001 may comprise a uniform cross-section along its depth, such that a part of the substrate surface 1001, this part being exposed by the opening 3000 and forming a ground face of the opening 3000, and an aperture 3001 of the opening 3000 at a layer surface 2001 of the structured layer 200 all possess a shape corresponding to the uniform cross-section.

The ground face may comprise a first field 1011 and a second field 1012, which may be fractions of the ground face and/or the substrate surface 1001. Both the first field 1011 and the second field 1012 may extend along the substrate surface 1001 between the substrate 100 and the structured layer 200. In one embodiment, the material of the substrate 100 in the area of the first field 1011 impedes the wetting by a solder material. Impeding the wetting by a solder material may comprise a property such that the respective material does not mix, solve, or form a solder connection to a solder material. In contrast to that, the material of the substrate 100 in the area of the second field 1012 does provide wetting to a solder material. Providing wetting to a solder material may comprise a property, that the respective material may solve, at least in part, in a liquid solder material or that it may form a solder connection with the solder material. Such wetting to a solder material may be provided by a metallization pad, a metallized area, a doping of the substrate 100, at least in the area of the second field 1012, and/or a specific treatment of the respective part of the substrate 100.

The opening 3000 may furthermore comprise a first partial opening 3100 and a second partial opening 3200. The first partial opening 3100 may be defined as a partial volume of the opening 3000 being located above the first field 1011 of the substrate surface 1001, whereas the second partial opening 3200 may be defined as a partial volume of the opening 3000 being located above the second field 1012 of the substrate surface 1001. The first partial opening 3100 and the second partial opening 3200 may form in conjunction the opening 3000.

The substrate 100 may comprise a semiconductor substrate, which, in turn, may comprise electronic, optical, and/or other functional elements. Such elements may comprise transistors, resistors, conductors, capacitors, inductors, diodes, emitters, sensors, insulators, lasers, and/or other entities as they are known from the manufacturing of integrated devices. For example, the substrate 100 may comprise a silicon substrate with an integrated circuit. Such integrated circuits may include a flip-chip, a memory circuit, a dynamic random access memory (DRAM) circuit, a memory controlling circuit, a central processing unit (CPU) circuit, a signal processing circuit, a logical circuit, an electronic signal processing circuit and/or an optical signal processing circuit. Furthermore, the substrate 100 may comprise more than one single substrate, i.e., a stack of individual and/or identical substrates. Furthermore, the substrate 100 may form a part or be a substrate of a substrate stack. Such a stack may comprise one or more identical substrates which are stacked, for example, in order to enhance a memory capacity, enhance a processing power, and/or distribute tasks to several sub-circuits of the integrated circuit.

The structured layer 200 may comprise a polymer, a photo resist, an SU8-photo resist, an oxide, silica, a solder stop paste, a passivation layer, and/or a material that impedes a wetting by a solder material. The openings 3000 in the structured layer 200 may be provided by means of photolithography, lithography, electron beam lithography, anisotropic etching, reactive ion etching, exposure to masked radiation, and/or other related techniques as they are known from the manufacturing of integrated devices.

In a subsequent process stage, the opening 3000 of the structured layer 200 may be filled with a solder material 400, as shown in FIG. 1B. The filling of the opening 3000 with the solder material 400 may be effected by means of a method as being described in conjunction with embodiments described herein. In this stage, a surface 4001 of the solder material 400 in the area of the layer surface 2001 may possess a curvature, such as a concave or convex curvature.

In a subsequent process stage, a part of the solder material 400 is ejected from the opening 3000 of the structured layer 200 (i.e. a portion of the solder material 400 protrudes from the opening 300), thereby forming a solder contact 600, as shown in FIG. 1C. The solder contact 600 may extend from the layer surface 2001 of the structured layer 200, and may, in this case, comprise a solder ball. Such a projecting solder contact 600 may subsequently be soldered, for example, to a module board, to a mother board, to a chip carrier, to a respective contact pad of a circuit board, or, in general, to any other circuit. In this way, a solder contact may be established to the integrated circuit 10 from any external circuitry.

In one embodiment, the solder material 400 is arranged in the opening 3000 and above it in such a way, that it forms a physical contact to the second field 1012, whereas the solder material 400 is separated from the first field 1011 for the largest part of the first field 1011. The largest part of the first field 1011 may be defined in a way that the fractional area of the first field 1011 which is still covered by the solder material 400 is less than the fractional area of the second field 1012 which has contact to the solder material 400. A fraction of solder material 400 that may be arranged in the first partial opening 3100 during preceding process stages, as they have been described in conjunction with FIGS. 1A and 1B, may now provide solder material 400 for the projecting solder contact 600. An ejection from the respective solder material 400 from the first partial opening 3100 may now form, at least in part, the solder contact 600. The first partial opening 3100 may, in this state, remain empty for most of its part, i.e., more solder material 400 is arranged in the second partial opening 3200 than in the first partial opening 3100.

Figure 2B:
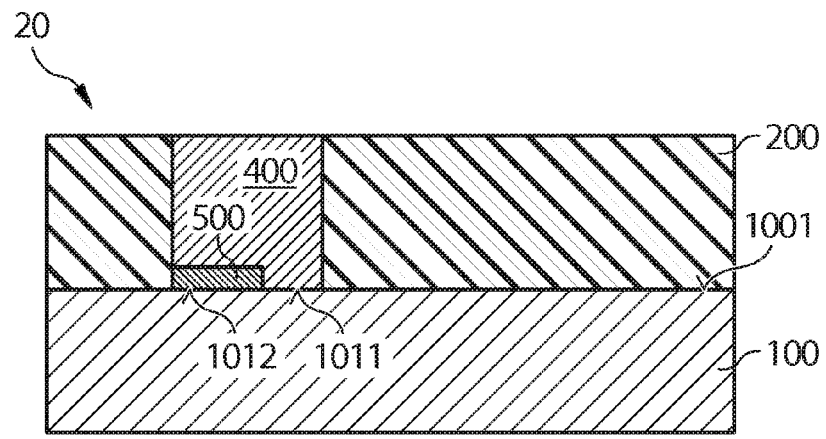
Figure 2C:
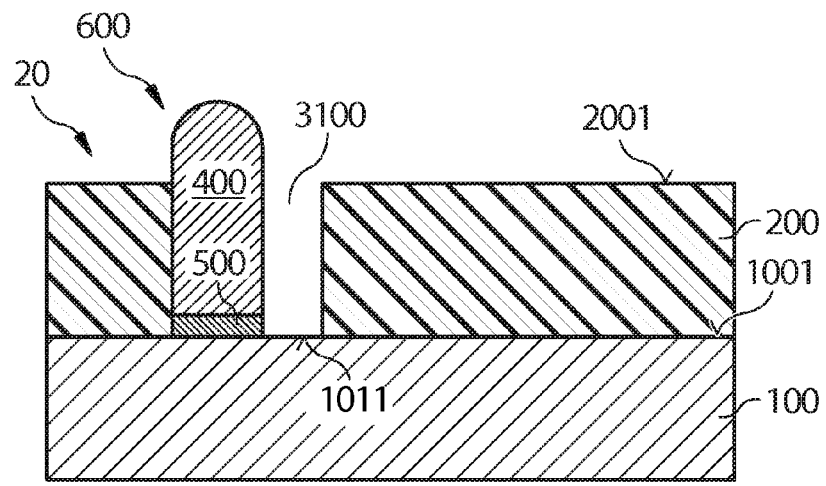

FIGS. 2A through 2C show an integrated circuit in various stages during manufacturing according to another embodiment. Accordingly, an integrated circuit 20 comprises the structured layer 200 and the substrate 100. The structured layer 200, comprising the opening 3000, is arranged on the substrate surface 1001. The opening 3000, exposes a part of the substrate surface 1001 in the area of the first field 1011.

In one embodiment, there may be arranged a metallization pad 500 on the substrate 100 in the area of the second field 1012. Whereas, the material in the area of the first field 1011 impedes a wetting by a solder material, the material and/or the surface of the metallization pad 500 may provide a wetting to a solder material. The metallization pad 500 may cover a part of the ground face of the opening 3000 and/or may extend on the substrate 100 between the substrate 100 and the structured layer 200. The metallization pad 500 may comprise a solderable material, such as nickel, nickel/gold, tin, lead, copper, silver, bismuth, aluminum, gold, or an alloy thereof. Furthermore, the metallization pad 500 may comprise a flux, such as collophony, urea, zinc chloride, and/or related flux materials. The metallization pad 500 may furthermore be provided as a an interface of a metal entity that may be buried in the substrate 100, such as an outer face of a metal signal line, a metallized via, or a cavity of the substrate 100 being filled with a respective metal.

Furthermore, at least a part of the ground face of the opening 3000 may not be covered by the metallization pad 500, and may, therefore, provide different wetting properties. The material of the substrate 100 and/or the material at the substrate surface 1001 may impede the wetting by a solder material. Furthermore, a solder stop material may be arranged on the substrate 100 in the area of the first field 1011.

In a subsequent process stage, the opening 3000 of the structured layer 200 may be filled with a solder material 400, as shown in FIG. 2B. The filling of the opening 3000 with the solder material 400 may be effected by means of a method as being described in conjunction with embodiments described herein.

In a subsequent process stage, a part of the solder material 400 may be ejected from the opening 3000 of the structured layer 200, thereby forming the solder contact 600, as shown in FIG. 2C. In one embodiment, the solder material 400 may be arranged in the opening 3000 and above it in such a way, that it forms a physical contact to the metallization pad 500, to which it may form a direct solder connection. The solder material 400 is separated from the first field 1011. The first partial opening 3100 may, in this state, remain empty for most of its part, i.e., more solder material 400 is arranged in the second partial opening 3200 adjacent to the metallization pad 500 than in the first partial opening 3100. The solder material 400 may also be accumulated above the metallization pad 500, which wets the solder material 400. Therefore, solder material 400 may be contracted above the metallization pad 500 and may be expelled from the partial opening 3100, in which the solder material 500 is a facing material and/or surfaces which impedes the wetting by the solder material 400. Hence, the projecting solder contact 600 may be formed by means of the accumulation of the solder material 400 above the metallization pad 500.

Figure 3A:
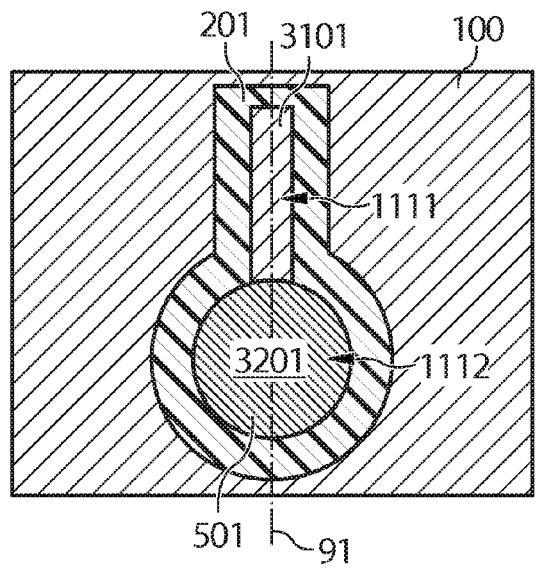
FIGS. 3A through 3C show a solder contact in various stages during manufacturing according to a further embodiment.
Figure 3B:
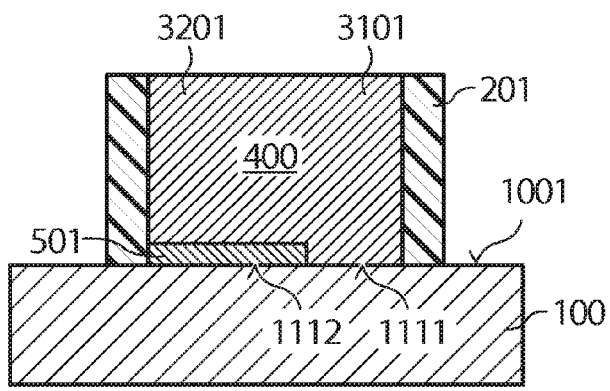
Figure 3C:
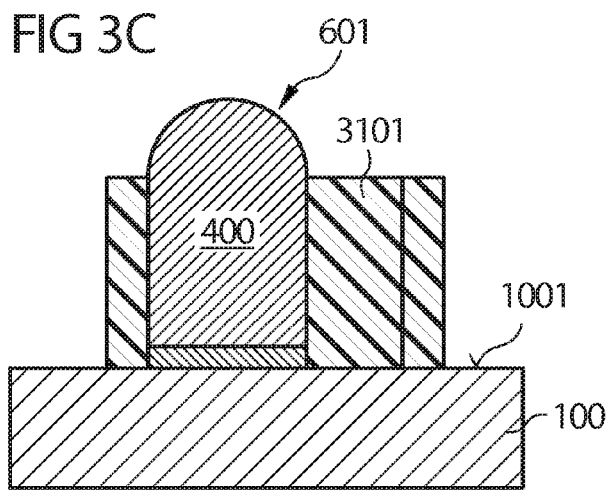

FIGS. 3A through 3C show a solder contact in various stages during manufacturing according to a further embodiment. FIG. 3A shows a schematic top view of a first partial opening 3101 and a second partial opening 3201 in a structured layer 201 on the substrate 100. The first partial opening 3101 above a first field 1111 of the substrate surface 1001 (as shown in FIGS. 3B and 3C) and the second partial opening 3201 above a second field 1112 of the substrate surface 1001 (as shown in FIGS. 3B and 3C) form a continuous opening in the structured layer 201. A metallization pad 501 is arranged on the substrate 100 in the area of the second field 1112, which may provide a wetting to a solder material. The material and/or the surface of the substrate 100 in the area of the first field 1111 impede the wetting by a solder material.

In one embodiment, the first field 1111 comprises a rectangular shape and the first partial opening 3101 may comprise a rectangular cross-section. An aspect ratio, being defined as the ratio of the length of the respective rectangular area divided by the width of the respective rectangular area, may be above 1, may be above 2, or may be above 5. The length of the respective rectangular area may be in a range of 1 to 10 microns, may be in a range of 10 to 100 microns, or may be in a range of 100 to 1000 microns. In addition to this, the second field 1112 may comprise a round shape and the second partial opening 3201 a round cross-section. Round geometries may include oval, circular, and/or a curvatured cross-section and shape. A median diameter of the respective round area may be in a range of 1 to 10 microns, may be in a range of 10 to 100 microns, or may be in a range of 100 to 1000 microns.

FIG. 3B shows a schematic cross-sectional view of the arrangement along the axis 91 as shown in FIG. 3A. Furthermore, as shown in FIG. 3B, the first partial opening 3101 and the second partial opening 3201 are filled with the solder material 400.

FIG. 3C shows a schematic cross-sectional view of the arrangement along the axis 91 as shown in FIG. 3A. Furthermore, as shown in FIG. 3C, a portion of the solder material 400 has been ejected from the first partial opening 3101 to provide solder material 400 for a projecting solder contact 601. The first partial opening 3101 may act as a reservoir for holding solder material 400 during a prior process stage, as shown in FIG. 3B, which may subsequently be ejected from the first partial opening 3101, as shown in FIG. 3C, to form the solder contact 601. In one embodiment, the round shape of the second field 3102 and the metallization pad 501 may provide a round or circular cross-section of the solder contact 601, which may, in turn, provide a solder ball with a regular and spherical curvature.

Figure 4A:
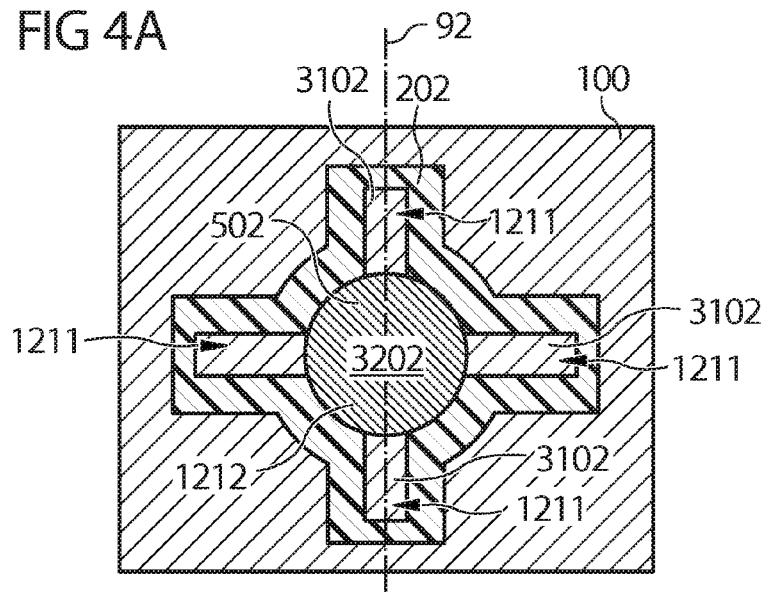
FIGS. 4A through 4C show a solder contact in various stages during manufacturing according to a further embodiment.
Figure 4B:
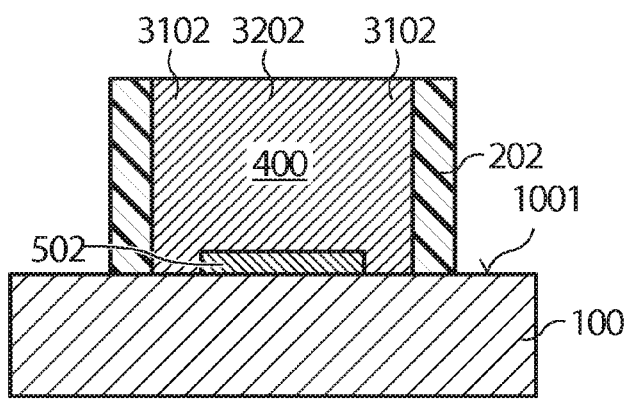
Figure 4C:
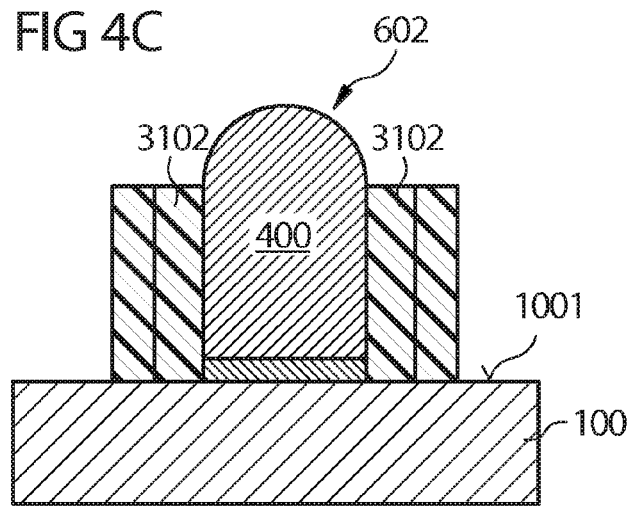

FIGS. 4A through 4C show a solder contact in various stages during manufacturing according to another embodiment. FIG. 4A shows a schematic top view of first partial openings 3102 and a second partial opening 3202 in a structured layer 202 on the substrate 100. The first partial openings 3102 above first fields 1211 of the substrate surface 1001 (as shown in FIGS. 4B and 4C) and the second partial opening 3202 above a second field 1212 of the substrate surface 1001 (as shown in FIGS. 4B and 4C) form a continuous opening in the structured layer 202. A metallization pad 502 is arranged on the substrate 100 in the area of the second field 1212.

In one embodiment, the first fields 1211 may comprise rectangular shapes and the first partial openings 3102 may comprise rectangular cross-sections. An aspect ratio of the respective rectangular areas may be above 1, may be above 2, or may be above 5. The length of the respective rectangular areas may be in a range of 1 to 10 microns, may be in a range of 10 to 100 microns, or may be in a range of 100 to 1000 microns. The arrangement of the first partial openings 3102 may be such that they extend radially from the second partial opening 3202. The second field 1212 may comprise a round shape and the second partial opening 3202 may comprise a round cross-section. A median diameter of the respective round area may be in a range of 1 to 10 microns, may be in a range of 10 to 100 microns, or may be in a range of 100 to 100 microns.

FIG. 4B shows a schematic cross-sectional view of the arrangement along the axis 92 as shown in FIG. 4A. Furthermore, as shown in FIG. 4B, the first partial openings 3102 and the second partial opening 3202 are filled with the solder material 400.

FIG. 4C shows a schematic cross-sectional view of the arrangement along the axis 92 as shown in FIG. 4A. Furthermore, as shown in FIG. 4C, a portion of the solder material 400 has been ejected from the first partial openings 3102 to provide solder material 400 for a projecting solder contact 602. The first partial openings 3102 may act as a reservoir for holding solder material 400 which may subsequently be ejected to form the solder contact 602. In one embodiment, a plurality of reservoirs may hold solder material 400 for the solder contact 602, which may provide an increased volume, size, diameter, and/or projection. Furthermore, the radial arrangement of the reservoirs as the first partial openings 3102 may influence the shape of the solder contact 602 and may provide an improved spherical curvature thereof.

Figure 5A:
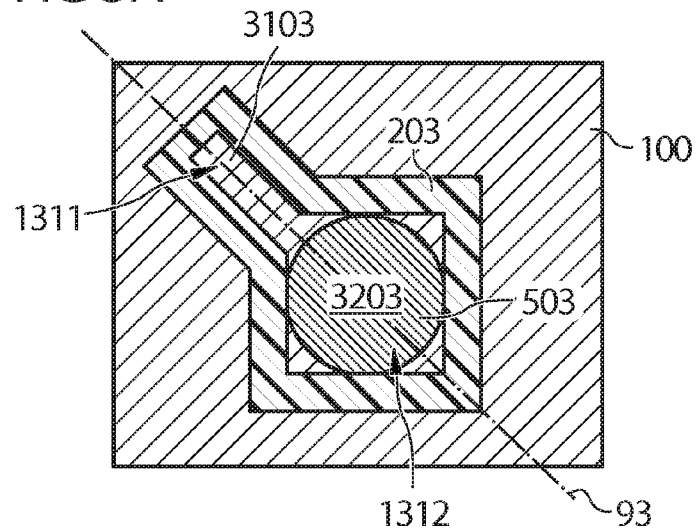
FIGS. 5A through 5C show a solder contact in various stages during manufacturing according to a further embodiment.
Figure 5B:
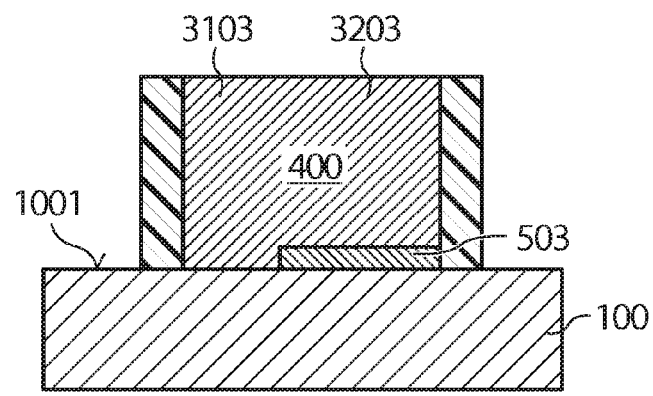
Figure 5C:
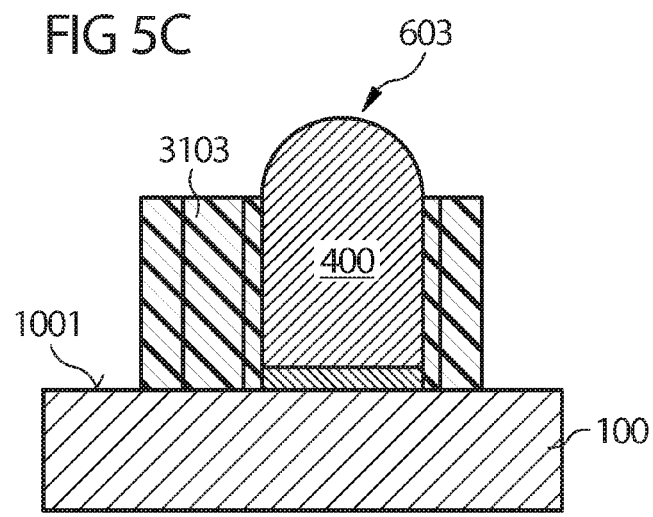

FIGS. 5A through 5C show a solder contact in various stages during manufacturing according to another embodiment. FIG. 5A shows a schematic top view of a first partial opening 3103 and a second partial opening 3203 in a structured layer 203 on the substrate 100. The first partial opening 3103 above a first field 1311 of the substrate surface 1001 (as shown in FIGS. 5B and 5C) and the second partial opening 3203 above a second field 1312 of the substrate surface 1001 (as shown in FIGS. 5B and 5C) form a continuous opening in the structured layer 203. A metallization pad 503 may be arranged on the substrate 100 in the area of the second field 1312.

In one embodiment, the first field 1311 may comprise a rectangular shape and the first partial opening 3103 may comprise a rectangular cross-section. The aspect ratio and the length of the respective rectangular area may be such as being described in conjunction with embodiments described herein. Furthermore, the second field 1312 may comprise a rectangular or square shape and the second partial opening 3203 may comprise a rectangular or square cross-section. An aspect ratio of the respective rectangular or square areas may be above 1, may be above 2, or may be above 5. The length of the respective rectangular or square areas may be in a range of 1 to 10 microns, may be in a range of 10 to 100 microns, or may be in a range of 100 to 1000 microns. Nevertheless, the shape or cross-section of the metallization pad 503 may be round and such to fit into the second field 1312. The arrangement of the first partial opening 3103 may be such that it is orienteered toward a corner or an edge of the second partial opening 3203.

FIG. 5B shows a schematic cross-sectional view of the arrangement along the axis 93 as shown in FIG. 5A. Furthermore, as shown in FIG. 5B, the first partial opening 3103 and the second partial opening 3203 are filled with the solder material 400.

FIG. 5C shows a schematic cross-sectional view of the arrangement along the axis 93 as shown in FIG. 5A. Furthermore, as shown in FIG. 5C, a portion of the solder material 400 has been ejected from the first partial openings 3103 to provide solder material 400 for a projecting solder contact 603. In one embodiment, the interface between the first partial opening 3103 and the second partial opening 3203 at a corner or an edge of the second partial opening 3203 may provide an improved channel for the solder material 400 when leaving the first partial opening 3103 and forming the solder contact 603. In addition to this, a round shape of the metallization pad 503 in conjunction with a rectangular shape of the second field 1312 may improve the formation of the solder contact 603.

Figure 6A:
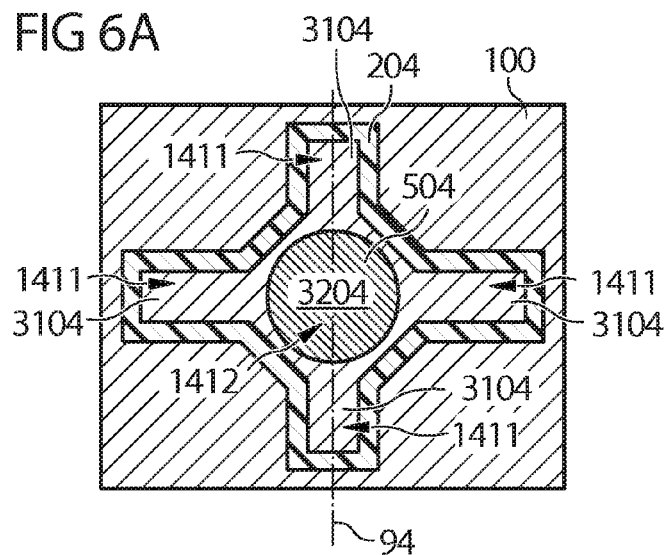
FIGS. 6A through 6C show a solder contact in various stages during manufacturing according to a further embodiment.
Figure 6B:
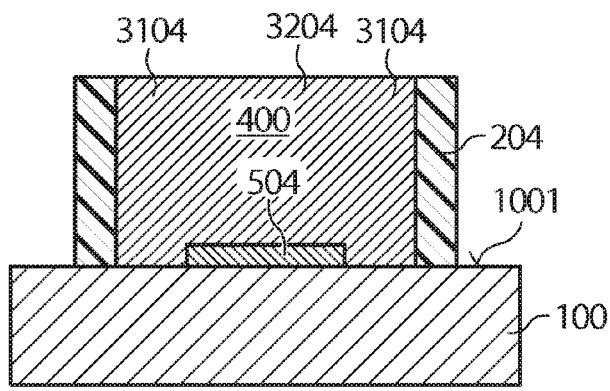
Figure 6C:
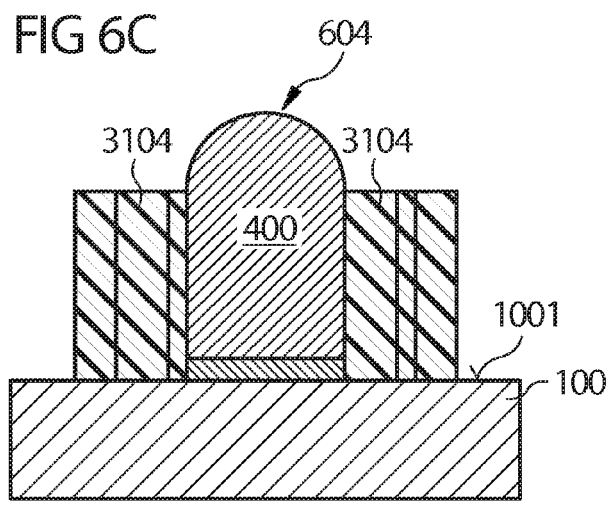

FIGS. 6A through 6C show a solder contact in various stages during manufacturing according to another embodiment. FIG. 6A shows a schematic top view of first partial openings 3104 and a second partial opening 3204 in a structured layer 204 on the substrate 100. The first partial openings 3104 above first fields 1411 of the substrate surface 1001 (as shown in FIGS. 6B and 6C) and the second partial opening 3204 above a second field 1412 of the substrate surface 1001 (as shown in FIGS. 6B and 6C) form a continuous opening in the structured layer 204. A metallization pad 504 is arranged on the substrate 100 in the area of the second field 1412.

In one embodiment, the first fields 1411 may comprise rectangular shapes and the first partial openings 3104 may comprise rectangular cross-sections. Furthermore, the second field 1412 may comprise a rectangular or square shape and the second partial opening 3204 may comprise a rectangular or square cross-section. The aspect ratio and the length of the respective rectangular or square areas be such as being described in conjunction with embodiments described herein. Nevertheless, the shape or cross-section of the metallization pad 504 may be round and such to fit into the second field 1412. The arrangement of the first partial openings 3104 may be such that they are orienteered toward a side face of the second partial opening 3204.

FIG. 6B shows a schematic cross-sectional view of the arrangement along the axis 94 as shown in FIG. 6A. Furthermore, as shown in FIG. 6B, the first partial openings 3104 and the second partial opening 3204 are filled with the solder material 400.

FIG. 6C shows a schematic cross-sectional view of the arrangement along the axis 94 as shown in FIG. 6A. Furthermore, as shown in FIG. 6C, a portion of the solder material 400 has been ejected from the first partial openings 3104 to provide solder material 400 for a projecting solder contact 604. In one embodiment, the plurality of reservoirs may hold solder material 400 for the solder contact 604, which may be increased in volume, size, diameter, and/or projection. Furthermore, the radial arrangement the reservoirs as the first partial openings 3104 and the inlets at side faces of the second partial opening 3204 may influence the shape of the solder contact 604 and may provide an improved spherical curvature thereof. In addition to this, a round shape of the metallization pad 504 in conjunction with a rectangular shape of the second field 1412 may improve the formation of the solder contact 604.

Figure 7A:
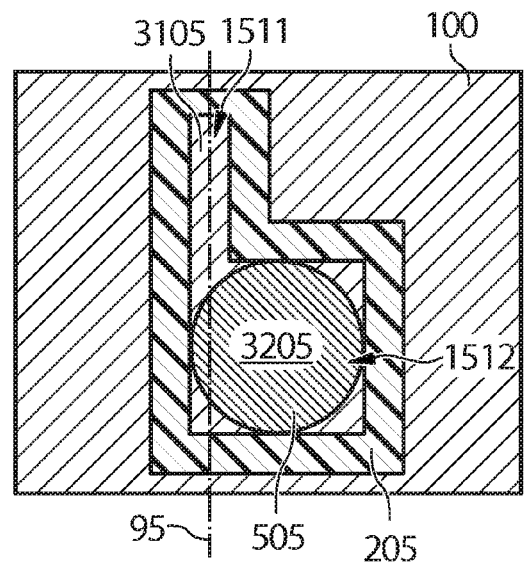
FIGS. 7A through 7C show a solder contact in various stages during manufacturing according to a further embodiment.
Figure 7B:
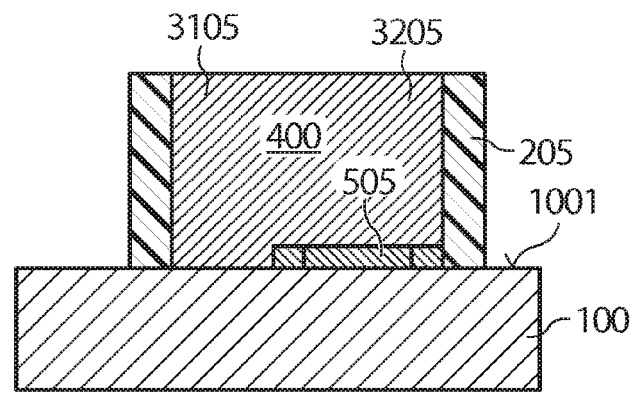
Figure 7C:
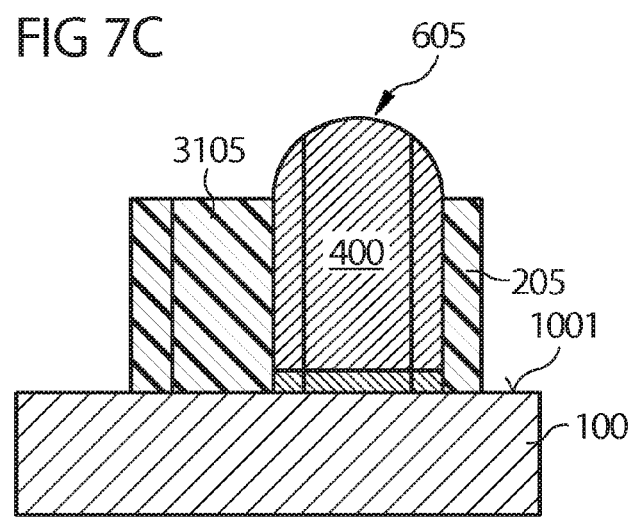

FIGS. 7A through 7C show a solder contact in various stages during manufacturing according to another embodiment. FIG. 7A shows a schematic top view of a first partial opening 3105 and a second partial opening 3205 in a structured layer 205 on the substrate 100. The first partial opening 3105 above a first field 1511 of the substrate surface 1001 (as shown in FIGS. 7B and 7C) and the second partial opening 3205 above a second field 1512 of the substrate surface 1001 (as shown in FIGS. 7B and 7C) form a continuous opening in the structured layer 205. A metallization pad 505 may be arranged on the substrate 100 in the area of the second field 1512.

In one embodiment, the first field 1511 may comprise a rectangular shape and the first partial opening 3105 may comprise a rectangular cross-section. Furthermore, the second field 1512 may comprise a rectangular or square shape and the second partial opening 3205 may comprise a rectangular or square cross-section. The aspect ratio and the length of the respective rectangular or square areas be such as being described in conjunction with embodiments described herein. Nevertheless, the shape or cross-section of the metallization pad 505 may be round and such to fit into the second field 1512. The arrangement of the first partial opening 3105 may be such that it is orienteered at a corner or an edge of the second partial opening 3205 and may be arranged perpendicular to one face of the second partial opening 3205.

FIG. 7B shows a schematic cross-sectional view of the arrangement along the axis 95 as shown in FIG. 7A. Furthermore, as shown in FIG. 7B, the first partial opening 3105 and the second partial opening 3205 are filled with the solder material 400.

FIG. 7C shows a schematic cross-sectional view of the arrangement along the axis 95 as shown in FIG. 7A. Furthermore, as shown in FIG. 7C, a portion of the solder material 400 has been ejected from the first partial openings 3105 to provide solder material 400 for a projecting solder contact 605. In one embodiment, the interface of the first partial opening 3105 and the second partial opening 3205 at a corner of the opening 3205 may provide an improved channel for the solder material 400 when leaving the first partial opening 3105 and forming the solder contact 605. An injection of liquid solder material into the second partial opening 3205 from the first partial opening 3105 at a corner may provide a spin to the liquid material, which, in turn, may improve a spherical geometry of a solder ball being formed by the solder contact 605. In addition to this, a round shape of the metallization pad 505 in conjunction with a rectangular shape of the second field 1512 may improve the formation of the solder contact 605.

Figure 8A:
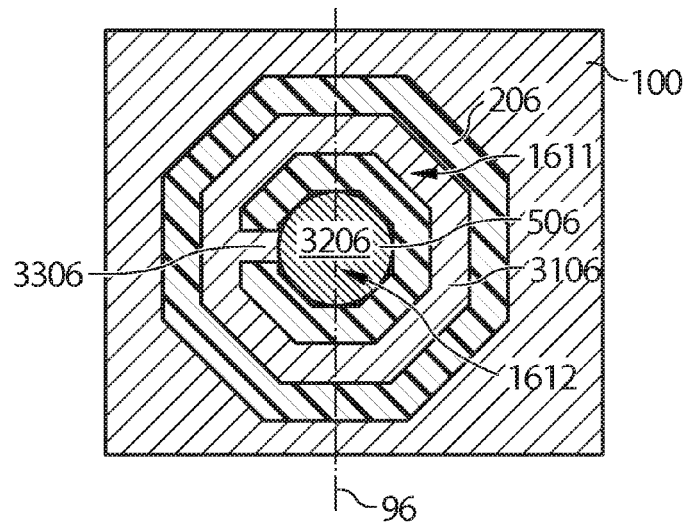
FIGS. 8A through 8C show a solder contact in various stages during manufacturing according to a further embodiment.
Figure 8B:
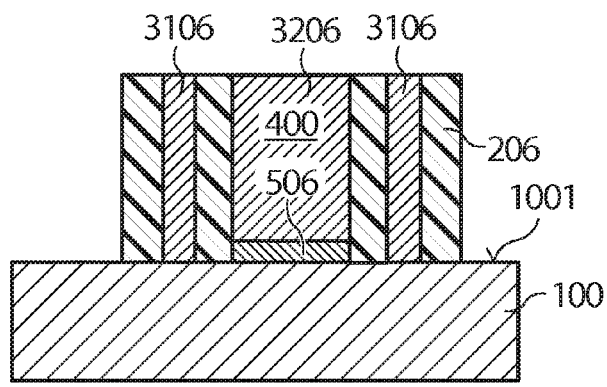
Figure 8C:
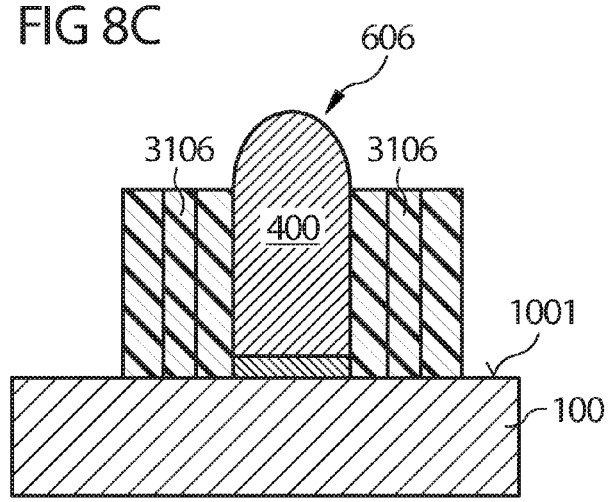

FIGS. 8A through 8C show a solder contact in various stages during manufacturing according to another embodiment. FIG. 8A shows a schematic top view of a first partial opening 3106 and a second partial opening 3206 in a structured layer 206 on the substrate 100. The first partial opening 3106 above a first field 1611 of the substrate surface 1001 (as shown in FIGS. 8B and 8C) and the second partial opening 3206 above a second field 1612 of the substrate surface 1001 (as shown in FIGS. 8B and 8C) form a continuous opening in the structured layer 206 and may be connected by a channel 3306 in the structured layer 206. A metallization pad 506 is arranged on the substrate 100 in the area of the second field 1612.

In one embodiment, the first field 1611 surrounds the second field 1612. Both the first field 1611 and the second field 1612 may comprise a rectangular, a round, a hexagonal, or a polygonal shape. The aspect ratio and the length of a side face of the respective areas may be such as being described in conjunction with embodiments described herein. Nevertheless, the shape or cross-section of the metallization pad 506 may be round and such to fit into the second field 1612.

FIG. 8B shows a schematic cross-sectional view of the arrangement along the axis 96 as shown in FIG. 8A. Furthermore, as shown in FIG. 8B, the first partial opening 3106 and the second partial opening 3206 are filled with the solder material 400.

FIG. 8C shows a schematic cross-sectional view of the arrangement along the axis 96 as shown in FIG. 8A. Furthermore, as shown in FIG. 8C, a portion of the solder material 400 has been ejected from the first partial opening 3106 to provide solder material 400 for a projecting solder contact 606. In one embodiment, a first partial opening 3106 which surrounds the second partial opening 3206 may provide an increased volume and thereby may provide more solder material 400 to the solder contact 606. Furthermore, the increased length along a circumference of the surrounding opening, in respect to a reduced width of the first partial opening 3106, may provide improved properties during ejection by means of surface tension forces (which may cause the solder to be pulled from the first field), while still providing a sufficient or even increased reservoir volume for holding solder material 400.

Figure 9:
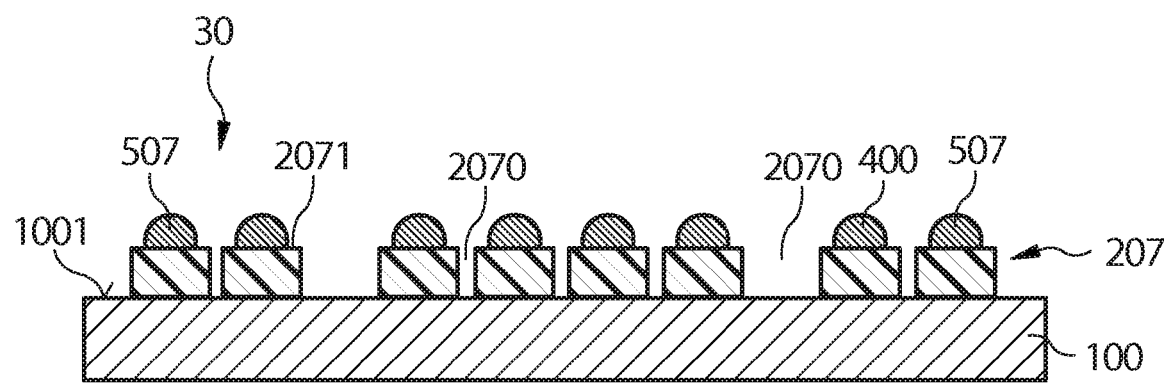
FIG. 9 shows a schematic side view of an integrated circuit according to another embodiment.

FIG. 9 shows a schematic side view of an integrated circuit according to another embodiment. An integrated circuit 30 comprises the substrate 100 and a structured layer 207 on the substrate surface 1001 of the substrate 100. In one embodiment, the structured layer 207 may comprise a discontinuous layer, hence comprising trenches 2070 and islands 2071 of the structured layer 207. In one embodiment, the discontinuous structured layer 207 may allow for subsequent molding-and/or underfill-processes. During such processes, the trenches 2070 may be filled with a package mold, a resin, a passivating material, and/or other related materials.

An island 2071 of the structured layer 207 may comprise an opening from which partially solder material 400 has been expelled to form solder contacts 507, which may comprise and/or provide the topography of a solder ball. Within the trenches 2070 of the structured layer 207, the material of the substrate 100 and/or the substrate surface 1001 may be accessible. The openings of the structured layer 207 may be such as described in conjunction with embodiments described herein. Furthermore, the substrate surface 1001 may comprise first and second fields, and/or metallization pads as described in conjunction with embodiments described herein.

Figure 10:
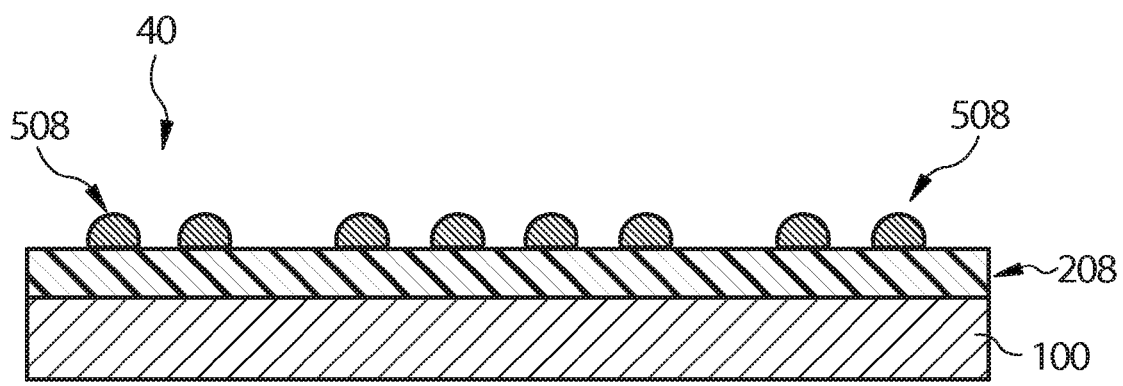
FIG. 10 shows a schematic side view of an integrated circuit according to another embodiment.

FIG. 10 shows a schematic side view of an integrated circuit according to another embodiment. An integrated circuit 40 comprises the substrate 100 and a structured layer 208 on the substrate surface 1001 of the substrate 100. In one embodiment, the structured layer 208 provides a continuous structured layer. On the continuous structured layer 208 there may be arranged solder contacts 508, which comprise a solder material 400 which has been expelled from an opening of the structured layer 208. The openings of the structured layer 208 may be such as described in conjunction with embodiments described herein. Furthermore, the substrate surface 1001 may comprise first and second fields, and/or metallization pads as described in conjunction with embodiments described herein.

Figure 11A:
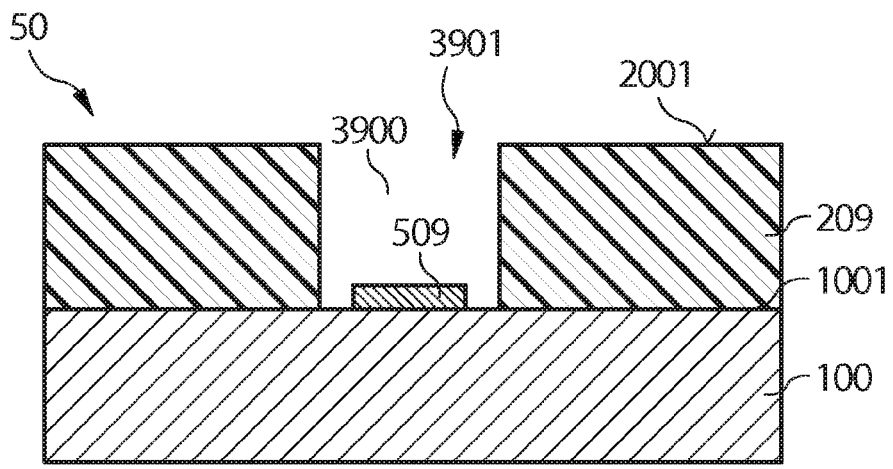
FIGS. 11A through 11F show schematic views of a solder contact being formed on a substrate, in various stages during manufacturing, according to another embodiment.

FIGS. 11A through 11F show schematic views of a solder contact being formed on a substrate, in various stages during manufacturing, according to another embodiment. As shown in FIG. 11A, a structured layer 209 may comprise an opening 3900 with an aperture 3901 at a layer surface 2001 of the structured layer 209. The opening 3900 may comprise any of the first partial openings and second partial openings, as they have been described in conjunction with embodiments described herein. On the substrate surface 1001 of the substrate 100 there is arranged a metallization pad 509 in the area of a second field. Nevertheless, the metallization pad 500 may be omitted, in the case that the material in the area of a second field provides wetting to a solder material. An integrated circuit 50 comprises the substrate 100 and the structured layer 209.

Figure 11B:
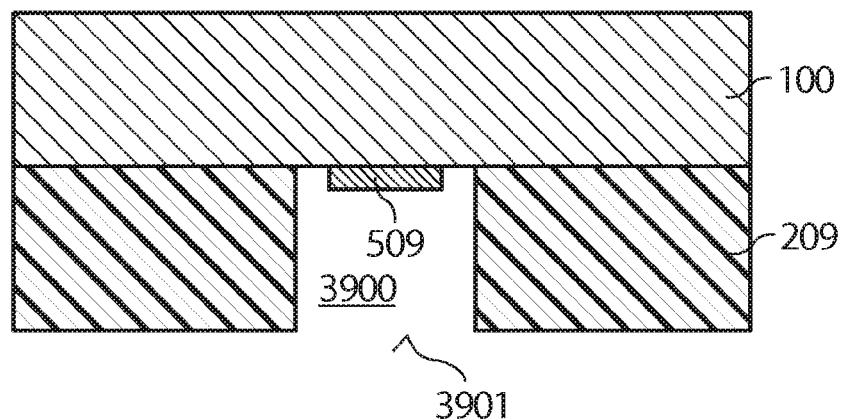

As shown in FIG. 11B, the integrated circuit 50, comprising the arrangement of the substrate 100 and the structured layer 209, may be arranged such that the aperture 3901 of the opening 3900 is facing downward. In the opening 3900 a first pressure is provided. This first pressure may be a vacuum pressure, a low atmospheric pressure, atmospheric pressure, a pressure below 10 mbar, a pressure below 1 mbar, or a pressure below $10^{-1}$ mbar. The first pressure may be provided by placing the integrated circuit 50 into a recipient, in which a controlled atmosphere and/or vacuum may be provided by means of pumps and/or respective pressure gauges.

Figure 11C:
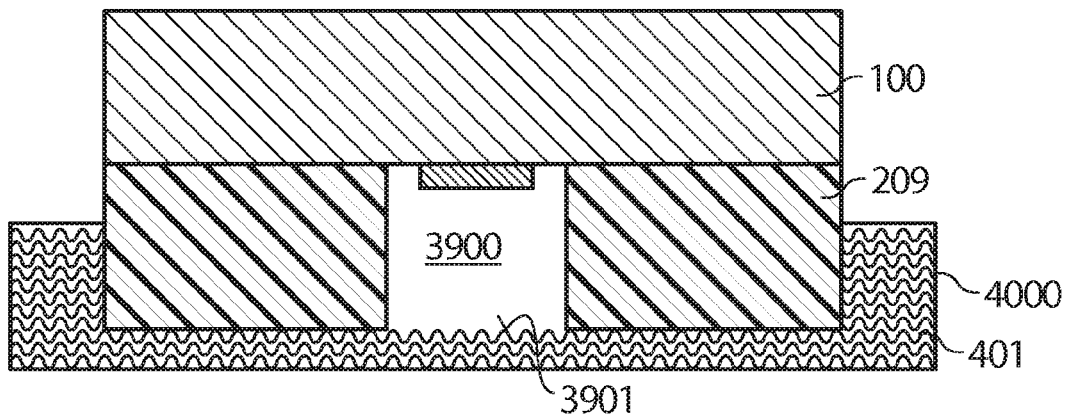

As shown in FIG. 11C, a bath 4000 of a liquid solder material 401 is provided to the aperture 3901 of the opening 3900. This may be effected, as shown, by dipping the integrated circuit 50 into the bath 4000. The liquid solder material 401 may be or comprise a solder material 401 in a liquid state and/or above a melting temperature of the solder material 401.

Furthermore, the liquid material 401 may be provided to the aperture 3901 of the opening 3900, for example, by placing the liquid material 401 on the structured layer 209, or covering the structured layer 209 with the liquid solder material 401. In this case, the arrangement of the substrate 100 and the structured layer 209 may be handled and left such as shown in FIG. 11A, i.e., the up-side-down flipping of the integrated circuit 50, as shown in FIG. 11B, may be omitted. Nevertheless, the first pressure is provided in the opening 3900 prior to the covering of the structured layer 209.

Figure 11D:
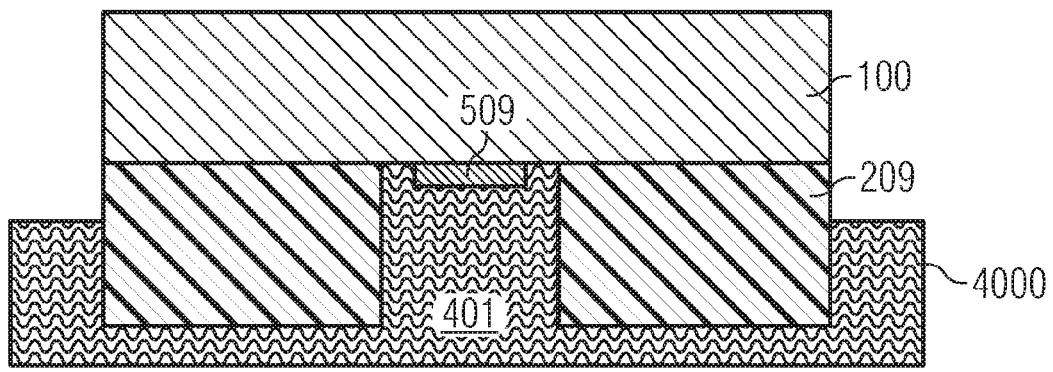

As shown in FIG. 11D, a second pressure is provided, acting onto the bath 4000 of the liquid solder material 401. In one embodiment, the second pressure is greater than the first pressure. The second pressure may be atmospheric pressure, high atmospheric pressure, in a range between 700 mbar and 1.3 bar, in a range of 1.3 bar and 3.0 bar, or in a range of 3.0 bar and 10.0 bar. By means of providing a second pressure, acting on the bath 4000, which is greater than the first pressure, liquid material 401 may be pressed into the opening 3900 (as shown in FIGS. 11A-11C), thereby filling the opening 3900 (as shown in FIGS. 11A-11C) with the liquid solder material 401.

Figure 11E:
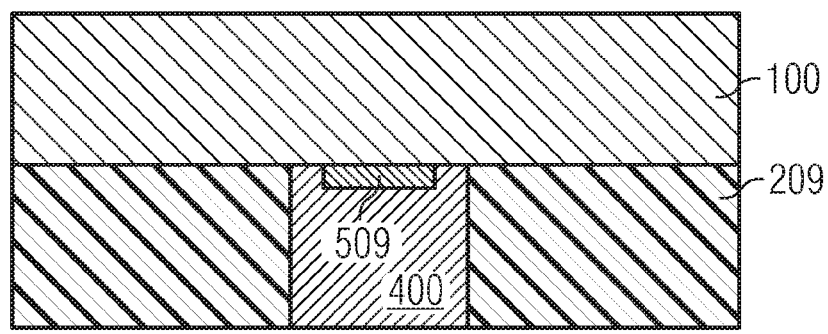

As shown in FIG. 11E, the integrated circuit 50 may be extracted from the bath 4000, and the opening 3900 remains filled, after solidification, with the solid solder material 400. Such a solidification may be effected by a cooling of the integrated circuit 50 with a well-defined and pre-determined temperature profile. A temperature profile comprises the controlled setting of the temperature of the integrated circuit 50 in respect to time.

Furthermore, in one embodiment, an oxide-layer on the solder material 400 in an area of the aperture 3901 (as shown in FIGS. 11A-11C) may be removed. Such an oxide may be formed on the solder material 400, when exposed to air, oxygen, or atmospheric conditions. The removal may be effected by an exposure of the oxide, a filled structured layer 209, or the integrated circuit 50 to a hydrogen-plasma, formic acid, forming gas, a combination of hydrogen and nitrogen, a flux, collophony, urea, zinc chloride, and/or related chemicals and gases. The removal of an oxide may be carried out prior to a reflow soldering process, or, in general, prior or during the ejection of the solder material from the opening.

Figure 11F:
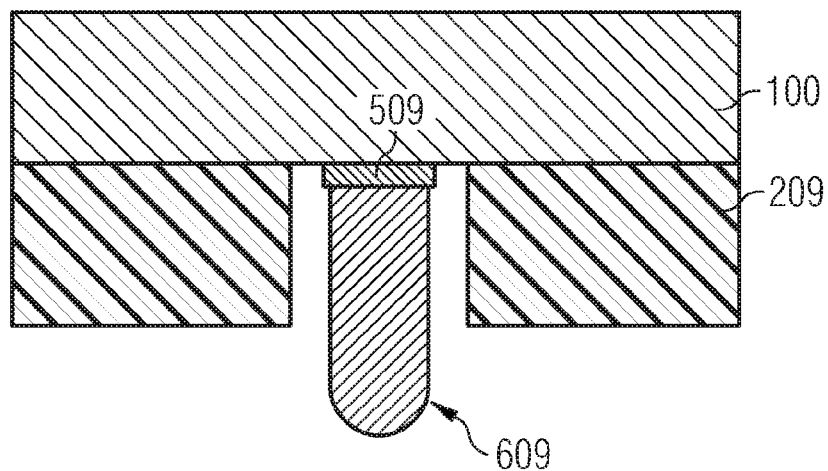

As shown in FIG. 11F, a solder contact 609 is formed on the surface of the structured layer 209. This may be effected by means of expelling a portion of the solder material 400 from the opening 3900 (as shown in FIGS. 11A-11C), by means of a further heating and or liquefaction of the solder material 400. Whereas the solder material 400 is kept in place above the metallization pad 509, solder material 400 is expelled from the opening 3900 when the facing material and/or surface impedes wetting to the solder material 400. An expulsion of the respective solder material 400 may be effected by means of surface tension acting on a liquefied solder material 400 within the opening 3900.

Such an expelling may include the transfer of solder material 400 from a partial opening of the opening 3900, acting as a reservoir, to solder contact 609. Such an expulsion, heating, or liquefaction may be conducted in a vacuum, in a vacuum below 10 mbar, in a vacuum below 1 mbar, or in a vacuum below $10^{-1}$ mbar.

The solder contact 609 may provide a solder ball being arranged on the surface of the structured layer 209. Such a solder ball may provide a geometry of a copper pillar or other related studs, stud bumps, or solder balls. Furthermore, the structured layer 209 may remain on the substrate 100 after formation of the solder contact 609, which may ease fabrication and/or reduce process complexity. By means of designing the shape and size of the opening 3900, in conjunction with the size, shape and position of the metallization pad 504, the volume, size, diameter, height, and/or projection of the solder contact 609 may be controlled.

Figure 12A:
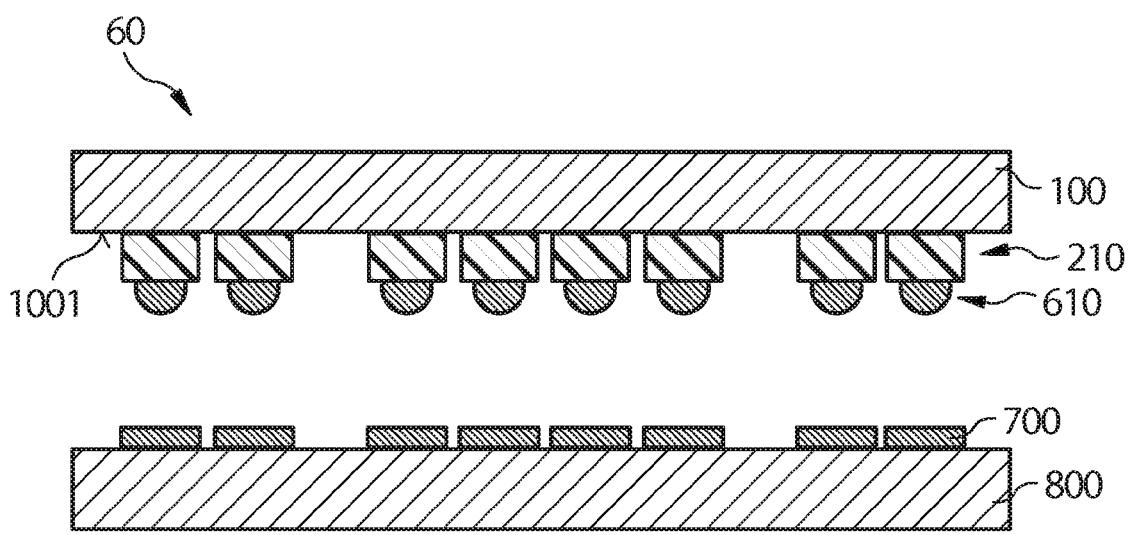
FIGS. 12A and 12B show schematic views of an integrated circuit in conjunction with a circuit board according to another embodiment.
Figure 12B:
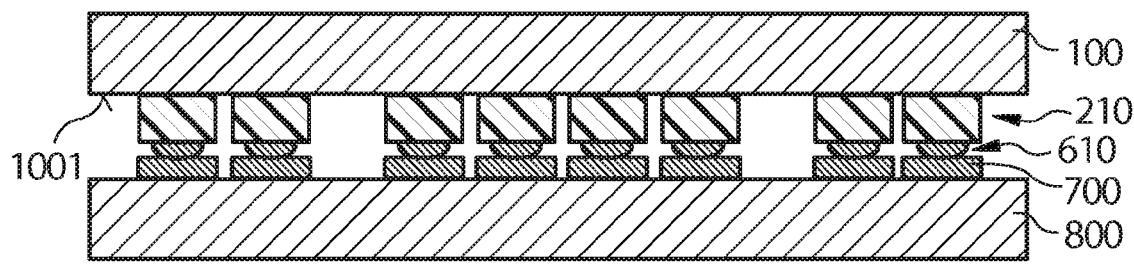

FIGS. 12A and 12B show schematic views of an integrated circuit in conjunction with a circuit board according to another embodiment. As shown in FIG. 12A, an integrated circuit 60 may comprise the substrate 100, a structured layer 210, and solder contacts 610. The integrated circuit 60 in this state may have been provided according to embodiments described herein. The solder contacts 610 may have been formed by a method which has been described in conjunction with embodiments described herein. Furthermore, the solder contacts 610 may have been formed by the expulsion of a solder material from a partial opening in the structured layer 210, whereas the solder contacts 610 are coupled to metallization pads which are arranged on the substrate surface 1001 of the substrate 100.

In one embodiment, the integrated circuit 60 may be connected to a circuit board 800 with contact pads 700. The circuit board 800 may comprise a module board, a printed circuit board (PCB), a motherboard, a module-in-package (MIP) board, a multi-module package (MMP) board, a carrier substrate, a chip carrier, and/or any other entity which may connect the integrated circuit 60 to an external circuitry, or may itself comprise a further integrated or external circuit. Furthermore, the integrated circuit 60 in conjunction with the circuit board 800 may form or comprise a flip-chip in package (FCiP) or a fine pitch flip-chip on chip (FCoC). In the latter case, the circuit board 800 may itself be or comprise a further substrate or a stack thereof. The contact pads 700 may be arranged on the circuit board 800 at the respective positions which match the positions of the solder contacts 610. Furthermore, the material and/or the surface of the contact pads 700 may provide a wetting to a solder material 400 of the solder contacts 610.

As shown in FIG. 12B, the arrangement of the substrate 100 and the structured layer 210 may be soldered to the circuit board 800. This may be effected by placing the integrated circuit 60 in the vicinity of the circuit board 800, such that the solder contacts 610 are brought into a close vicinity of the respective contact pads 700 or are brought into mechanical contact with the contact pads 700. A soldering process, such as a reflow soldering process, an infrared soldering process, or an ultrasonic soldering process, may liquefy the solder contacts 610 and promote, in this way, a soldering to the contact pads 700. After solidification, the solder balls 610 may form solid solder contacts 610 to the contact pads 700. Such soldering process may be conducted in a vacuum, in a vacuum below 10 mbar, in a vacuum below 1 mbar, or in a vacuum below $10^{-1}$ mbar.

Figure 13A:
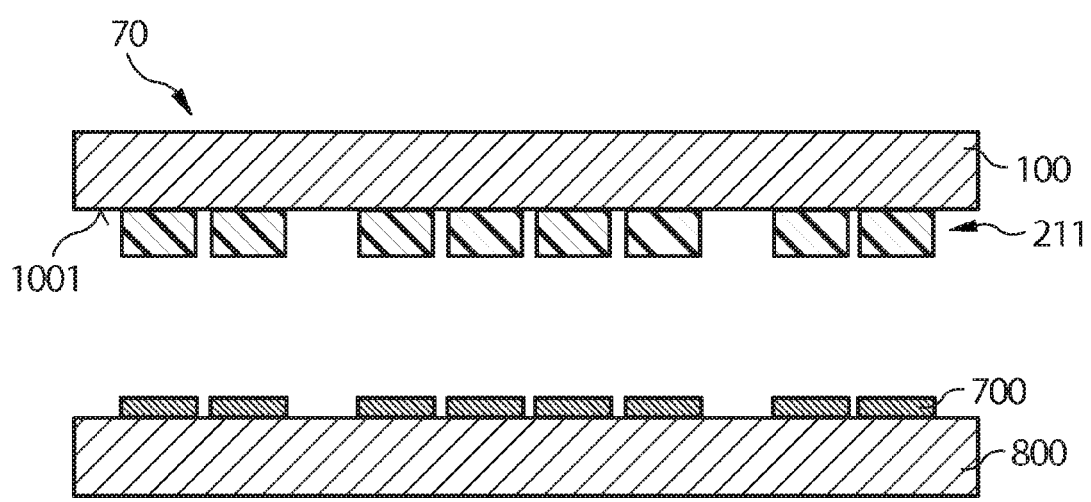
FIGS. 13A and 13B show schematic views of an integrated circuit in conjunction with a circuit board according to another embodiment.
Figure 13B:
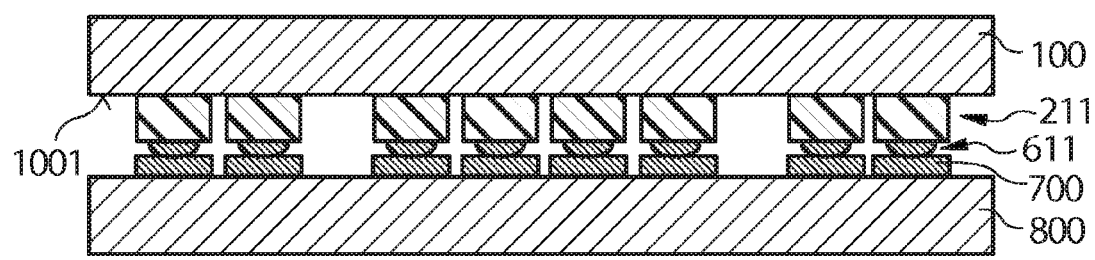

FIGS. 13A and 13B show schematic views of an integrated circuit in conjunction with a circuit board according to another embodiment. As shown in FIG. 13A, an integrated circuit 70 comprises the substrate 100, a structured layer 211. The structured layer may comprise openings being filled with a solder material. The openings, the solder material, and the filling thereof may be according to an implementation as described in conjunction with embodiments described herein. The integrated circuit 70 is to be connected to the circuit board 800 with contact pads 700, which has been described in conjunction with FIG. 12A.

As shown in FIG. 13B, the integrated circuit 70 is soldered to the circuit board 800. This may be effected by placing the integrated circuit 70 in the vicinity of the circuit board 800 and a subsequent soldering process. Such a solder process liquefies the solder material in the openings of the structured layer 211, thereby ejecting a portion thereof. The portion of the solder material may establish a mechanical contact to the contact pads 700 through ejection and may be soldered to the material and/or the surface of the contact pads 700. Hence, In one embodiment, the solder material 400 may remain in the openings of the structured layer 211. In this way, a portion of the solder material 400 may be expelled from the openings of the structured layer 211 and may form a solder contact 611 to the facing contact pads 700 on the circuit board 800. Furthermore, the integrated circuit 60 in conjunction with the circuit board 800 may form or comprise a flip-chip in package (FCiP) or a fine pitch flip-chip on chip (FCoC). In the latter case, the circuit board 800 may itself be or comprise a further substrate or a stack thereof.

Figure 14:
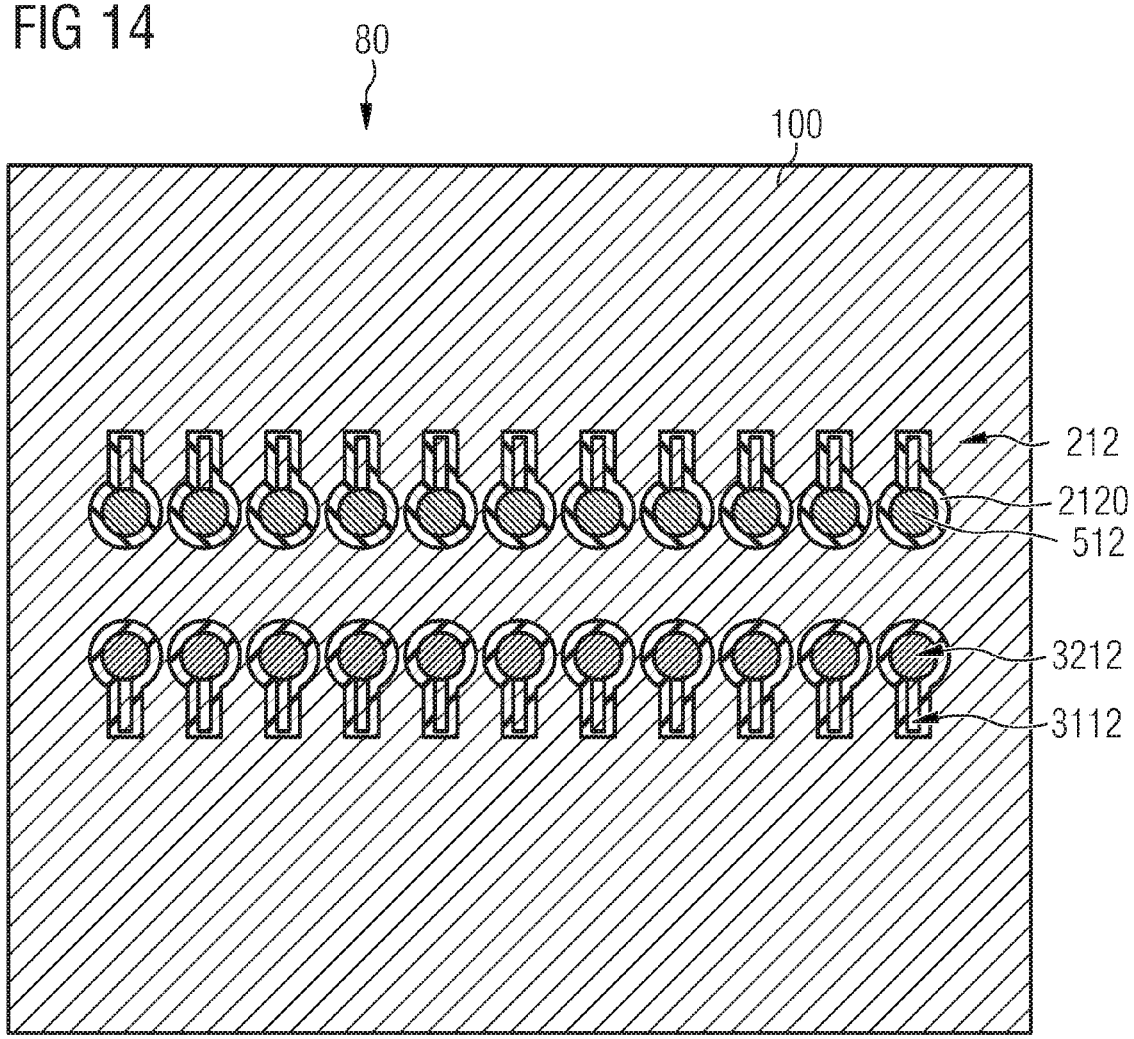
FIG. 14 shows a schematic top view of a fraction of an integrated circuit according to yet another embodiment.

FIG. 14 shows a schematic top view of a portion of an integrated circuit according to yet another embodiment. Accordingly, an integrated circuit 80 may comprise the substrate 100 and a structured layer 212, which may comprise islands 2120 of the structured layer 212. The islands 2120 comprise a first partial opening 3112 and a second partial opening 3212. The first partial opening 3112 may be arranged on the substrate 100 such that the surface of the substrate is exposed, whereas a metallization pad 512 is arranged in the area of the second opening 3212. The surface and/or the material of the metallization pad 512 may provide a wetting to a solder material, whereas the surface and/or the material of the surface of the substrate or the substrate 100 impedes the wetting by a solder material. The openings, comprising the first partial opening 3212 and the second partial opening 3212, may be filled with a solder material, which, in a subsequent process stage, may be partially expelled in order to form a solder contact.

In one embodiment, the islands 2120 may be arranged in a regular array. Accordingly, the array of the solder contacts may provide a plurality of solder contacts and contacts to an integrated circuit in parallel.

According to another embodiment, the opening may be filled with a liquid solder material, a liquefied solder material, a granular solder material, a powder-like solder material, and/or a paste-like solder material. In this way, process temperatures during filling the openings with the solder material may be reduced and an overall thermal budget may be decreased. Furthermore, a combination of a solder material and a flux material, for example in form of a granular solder material in a flux matrix or in form of a solder paste, may be applied to the opening in a single process stage.

The preceding description only describes advantageous exemplary implementations of the invention. The features disclosed therein and the claims and the drawings can, therefore, be important for the realization of the invention in its various implementations, both individually and in combination. While the foregoing is directed to implementations of the present invention, other and further implementations of this invention may be devised without departing from the basic scope of the invention. The scope of the present invention being determined by the claims as follows.

What is claimed is:

1. A method of forming a solder contact to a substrate, the method comprising:
    providing a first field on a surface of the substrate, wherein the first field impedes a wetting by a solder material;
    providing a second field on the surface of the substrate, wherein the second field is wettable by the solder material;
    providing a structured layer on the surface, wherein the structured layer comprises an opening to the substrate, and wherein the opening, at least in part, exposes both the first field and the second field;
    filling the opening with the solder material, whereby the solder material is brought into contact with the first field and the second field; and liquefying the solder material, whereby the solder material is pulled from the first field, and a portion of the solder material is caused to protrude from the opening, wherein the portion of the solder material forms the solder contact.

2. The method as claimed in claim 1, wherein providing the second field comprises a providing of a metallization pad on the surface of the substrate.

3. The method as claimed in claim 1, wherein filling the opening with the solder material comprises:
providing a first pressure in the opening;
providing a liquefied solder material to an aperture of the opening; and
providing a second pressure to the liquefied solder material, wherein the second pressure is greater than the first pressure, thereby filling the opening with the solder material.

4. The method as claimed in claim 1, wherein the opening is filled with any solder material of the group of a liquid solder material, a liquefied solder material, a granular solder material, a powder-like solder material, and a paste-like solder material.

5. The method as claimed in claim 1, wherein providing the structured layer comprises:
providing a photo resist layer;
exposing the photo resist layer to masked radiation; and
removing a part of the photo resist layer in an area of the opening, thereby forming the structured layer.

6. The method as claimed in claim 1, wherein the portion of the solder material caused to protrude from the opening is solidified, thereby forming a solder ball.

7. The method as claimed in claim 1, wherein the portion of the solder material caused to protrude from the opening is soldered to a contact pad of any of the group of a circuit board, a printed circuit board, a mother board, a module board, and a chip carrier, thereby forming a solder contact from the substrate to the contact pad.

8. The method as claimed in claim 1, wherein the method further comprises a removing of an oxide on the solder material after the filling of the opening with the solder material.

9. A method of fabricating an integrated circuit, the method comprising:
providing a substrate, wherein the substrate comprises a functional circuit;
providing metallization pads on a surface of the substrate, wherein the metallization pads are coupled to the functional circuit;
providing a structured layer on the surface, wherein the structured layer comprises an opening, wherein the opening exposes, at least in part, both the metallization pad and the surface of the substrate;
filling the opening with a solder material, whereby the solder material is brought into contact with the first field and the second field; and
liquefying the solder material, whereby the solder material is pulled from the surface of the substrate in the opening and a portion of the solder material is caused to protrude from the opening, the portion of the solder material forming a solder ball.

10. The method as claimed in claim 9, wherein filling the opening with the solder material further comprises:
providing a bath of a liquid solder material;
providing a first pressure in the opening of the structured layer and atop the bath;
dipping the structured layer with the substrate into the bath, thereby covering an aperture of the opening with the bath;
providing a second pressure to the bath, wherein the second pressure is greater than the first pressure, thereby filling the opening with the solder material; and
retracting the substrate with the structured layer from the bath.

11. The method as claimed in claim 10, wherein the substrate and the structured layer is cooled after retracting from the bath, thereby solidifying the solder material in the opening.

* * * * *

UNITED STATES PATENT AND TRADEMARK OFFICE
CERTIFICATE OF CORRECTION

PATENT NO. : 7,745,321 B2  
APPLICATION NO. : 11/972793  
DATED : June 29, 2010  
INVENTOR(S) : Alfred Martin et al.

Page 1 of 1

It is certified that error appears in the above-identified patent and that said Letters Patent is hereby corrected as shown below:

On the title page, please replace the Assignee section with the following:

Item (73)   Assignees: Qimonda AG, Munich (DE)  
Infineon Technologies AG, Neubiberg (DE)

Signed and Sealed this  
Twenty-ninth Day of October, 2013

Teresa Stanek Rea  
*Deputy Director of the United States Patent and Trademark Office*